United States Patent
Yoriki

(10) Patent No.: US 11,058,040 B2
(45) Date of Patent: Jul. 6, 2021

(54) OPERATION CHECKING DEVICE OF ELECTRONIC MOUNTING MACHINE

(71) Applicant: FUJI CORPORATION, Chiryu (JP)

(72) Inventor: Minoru Yoriki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 261 days.

(21) Appl. No.: 16/086,752

(22) PCT Filed: Mar. 29, 2016

(86) PCT No.: PCT/JP2016/060245
§ 371 (c)(1),
(2) Date: Sep. 20, 2018

(87) PCT Pub. No.: WO2017/168590
PCT Pub. Date: Oct. 5, 2017

(65) Prior Publication Data
US 2019/0104655 A1    Apr. 4, 2019

(51) Int. Cl.
*H05K 13/04*    (2006.01)
*H05K 13/08*    (2006.01)
*H05K 13/00*    (2006.01)

(52) U.S. Cl.
CPC ..... *H05K 13/0406* (2018.08); *H05K 13/0015* (2013.01); *H05K 13/04* (2013.01);
(Continued)

(58) Field of Classification Search
CPC ........... H05K 13/0406; H05K 13/0409; H05K 13/04; H05K 13/085; H05K 13/0853;
(Continued)

(56) References Cited

U.S. PATENT DOCUMENTS

| 5,937,143 A | 8/1999 | Watanabe et al. |
| 2002/0069395 A1* | 6/2002 | Fujiwara .............. H05K 13/083 716/112 |

(Continued)

FOREIGN PATENT DOCUMENTS

| JP | 61-194507 A | 8/1986 |
| JP | 1-318300 A | 12/1989 |

(Continued)

OTHER PUBLICATIONS

International Search Report dated Jun. 21, 2016 in PCT/JP2016/060245 filed Mar. 29, 2016.

*Primary Examiner* — Peter Dungba Vo
*Assistant Examiner* — Jeffrey T Carley
(74) *Attorney, Agent, or Firm* — Oblon, McClelland, Maier & Neustadt, L.L.P.

(57) ABSTRACT

An operation checking device of an electronic component mounting machine is provided with a first memory section configured to memorize an operation program of the electronic component mounting machine including at least a collection operation of an electronic component by a collecting device; a second memory section configured to memorize shape data of the electronic component and shape data of the collecting device; a first acquiring section configured to acquire information of the electronic components and information of the collecting device based on the operation program required for a current operation memorized on the first memory section; and a second acquiring section configured to acquire corresponding shape data of the electronic component and shape data of the collecting device from the second memory section based on the information of the electronic component and the information of the collecting device acquired by the first acquiring section.

9 Claims, 11 Drawing Sheets

(52) U.S. Cl.
CPC ..... *H05K 13/0409* (2018.08); *H05K 13/0853* (2018.08); *H05K 2203/162* (2013.01); *H05K 2203/163* (2013.01); *H05K 2203/168* (2013.01)

(58) Field of Classification Search
CPC ........... H05K 13/0882; H05K 13/0015; H05K 2203/162; H05K 2203/163; H05K 2203/168

See application file for complete search history.

(56) References Cited

U.S. PATENT DOCUMENTS

| | | | | |
|---|---|---|---|---|
| 2005/0129304 | A1* | 6/2005 | Sasazawa | G01B 11/0608 382/150 |
| 2006/0265865 | A1* | 11/2006 | Yoshida | H05K 13/0069 29/729 |
| 2008/0154392 | A1* | 6/2008 | Maenishi | H05K 13/085 700/32 |
| 2008/0263858 | A1* | 10/2008 | Onishi | H05K 13/082 29/743 |
| 2014/0272103 | A1* | 9/2014 | Prince | H05K 13/0469 427/8 |
| 2015/0096687 | A1* | 4/2015 | Tsuboi | H05K 13/0812 156/378 |
| 2016/0320314 | A1* | 11/2016 | Suzuki | B23K 1/00 |
| 2018/0357755 | A1* | 12/2018 | Seo | G01B 11/0608 |

FOREIGN PATENT DOCUMENTS

| | | | |
|---|---|---|---|
| JP | 5-224734 A | 9/1993 | |
| JP | 9-85655 A | 3/1997 | |
| JP | 2009-218461 A | 9/2009 | |
| JP | 2014-110395 A | 6/2014 | |
| WO | WO-2017014518 A1 * | 1/2017 | ....... G01N 21/95684 |

* cited by examiner

OPERATION CHECKING DEVICE OF ELECTRONIC MOUNTING MACHINE

TECHNICAL FIELD

The present application relates to an operation checking device of an electronic component mounting machine.

BACKGROUND ART

Disclosed in patent literature 1 is a device, in an electronic component mounting machine, that displays electronic components to be mounted on a board and electronic components already mounted on the board in three dimensions. By this, it is possible to check whether electronic components to be mounted on the board will interfere with already mounted components when performing mounting.

CITATION LIST

Patent Literature

Patent literature 1: JP-A S&1-194507

BRIEF SUMMARY

Technical Problem

In an electronic component mounting machine, electronic components supplied by multiple supply devices arranged lined up side by side are picked up (collected) by a nozzle, moved to a board, and mounted. Therefore, when an operator is programming an operation program for the electronic component mounting machine, if a pickup (collection) position of a nozzle is entered incorrectly, there is a danger that the nozzle will interfere with a supply device adjacent to the supply device of the electronic component that is the target for collection or with an electronic component supplied by that supply device.

Also, in an electronic component mounting machine, not only are small electronic components such as bare chips mounted on a board, large electronic components such as radial components such as capacitors with leads, and axial components such as resistors are also mounted. With such large electronic components, when performing collection from the supply device using a collecting device, instead of pickup via suction using a nozzle, components are gripped by a clamp member. Thus, the danger of interference of the clamp member and the supply device adjacent to the supply device of the electronic component that is the target for collection or an electronic component supplied by that supply device is higher when gripping (collecting) an electronic component with a large clamp member than when picking up (collecting) a small electronic component with a nozzle. However, it is not possible to check the above interference with conventional technology.

An object of the present disclosure is to provide an operation checking device of an electronic component mounting machine capable of checking operation from collecting to mounting of an electronic component, in particular during collecting.

Solution to Problem

An operation checking device of an electronic component mounting machine of the present disclosure is for an electronic component mounting machine that uses a collecting device to collect an electronic component supplied at a component supply position of a supply device, move the collected electronic component to a board conveyed to a board conveyance position, and mount the collected electronic component at a component mounting position of the board, the operation checking device including: a first memory section configured to memorize an operation program of the electronic component mounting machine including at least a collection operation of the electronic component by the collecting device; a second memory section configured to memorize shape data of the electronic component and shape data of the collecting device; a first acquiring section configured to acquire information of the electronic components and information of the collecting device based on the operation program required for a current operation memorized on the first memory section; and a second acquiring section configured to acquire corresponding shape data of the electronic component and shape data of the collecting device from the second memory section based on the information of the electronic component and the information of the collecting device acquired by the first acquiring section.

The operation checking device also includes a processing section configured to perform processing of operation simulation of the electronic component mounting machine based on the operation program required for the current operation memorized on the first memory section, and a display section configured to acquire component coordinates of the electronic component during collection of the electronic component by the collecting device and tool coordinates of the collecting device based on the operation simulation processed by the processing section, and display in three dimensions the shape data of the electronic component and the shape data of the collecting device acquired by the second acquiring section at the acquired component coordinates and tool coordinates. Accordingly, it is possible to check operation from collecting to mounting of an electronic component, in particular during collecting, enabling the electronic component to be collected reliably and improving component mounting efficiency.

DESCRIPTION OF EMBODIMENTS

1. Overall Configuration of Electronic Component Mounting Machine

Figure 1:
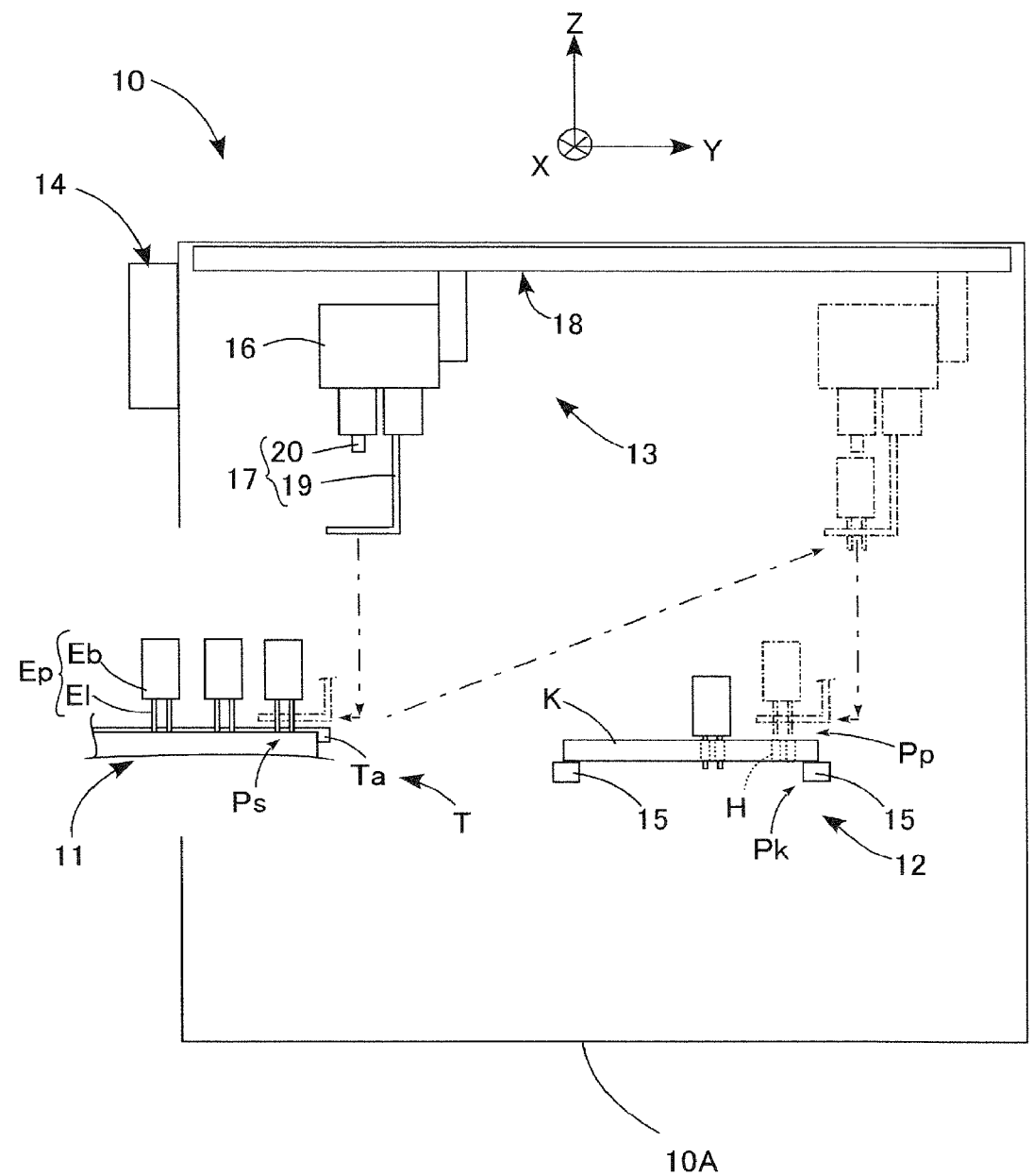
FIG. 1 shows an overview of the configuration of an electronic component mounting machine to which an embodiment of an operation checking device of an electronic component mounting machine is applied.

An overview of the configuration of an electronic component mounting machine to which an embodiment of an operation checking device of an electronic component mounting machine is applied is described below with reference to the figures. As shown in FIG. 1, electronic component mounting machine 10 is provided with items such as component supply device 11 arranged at a front side (left side in the figure) of mounting machine main body 10A, board conveyance device 12 arranged at a rear side (right side in the figure) of mounting machine main body 10A, component transfer device 13 arranged above component supply device 11 and board conveyance device 12, and control device 14 that controls component mounting operation. Note that, in FIG. 1, the conveyance direction of board K by board conveyance device 12 is the X direction, the direction perpendicular to the X direction in a horizontal plane is the Y direction, and the direction perpendicular to the X and V directions is the Z direction.

Component supply device 11 is for supplying electronic components Ep, and multiple component supply devices 11 are arranged lined up in the X direction. In this embodiment, electronic components Ep are radial components such as capacitors with two leads El protruding parallel to each other from an end of main body section Eb. Multiple electronic components Ep are held in a line sandwiched between base tape Ta of carrier tape T and adhesive tape, which is not shown. Carrier tape T is folded up and stored in a storage box, which is not shown, provided on a rear section of component supply device 11.

Component supply device 11 feeds carrier tape T in the Y direction from the storage box at a specified pitch to position an electronic component Ep in an upright state with main body section Eb above leads El, and consecutively moves the electronic component Ep to component supply position Ps at a front section of component supply device 11. Board conveyance device 12 is for conveying boards K and is provided with items such as belt conveyor 15. Board conveyance device 12 conveys board K loaded on belt conveyors 15 in the X direction to board conveyance position Pk and fixes the board K at that position.

Component transfer device 13, in this embodiment, is for gripping and moving electronic component Ep and is provided with items such as component mounting head 16, component collecting device 17 provided on component mounting head 16, and head moving device 18 on which component mounting head 16 is supported in a movable manner. Component collecting device 17 is provided with shaft 20 that can be raised and lowered in the Z direction by an air cylinder, and pair of clamp members 19 (gripping claws) that can open and close in the XV plane via an air cylinder. Head moving device 18 is an XV robot.

Component transfer device 13 uses clamp member 19 to collect electronic component Ep supplied at component supply position Ps, uses head moving device 18 to move electronic component Ep to component mounting position Pp of board K, and applies pressure to main body section Eb of electronic component Ep using shaft 20 to mount the electronic component Ep by inserting leads El into insertion holes H provided at the component mounting position Pp.

2. Operation of Electronic Component Mounting Machine

Operation of the above electronic component mounting machine 10 is controlled by control device 14 executing an operation program, and this operation is described with reference to FIGS. 1 and 2. Control device 14 moves clamp member 19 that is in an open state to collecting start position Q1 above component supply position Ps (Si of FIG. 2). Then, control device 14 moves clamp member 19 in an open state to collecting intermediate position Q2 at a height of leads El of the electronic component Ep supplied to component supply position Ps (92 of FIG. 2). Next, control device 14 moves clamp member 19 in an open state towards leads El of the electronic component Ep to a position at which gripping of the leads El is possible (93 of FIG. 2).

Figure 2:
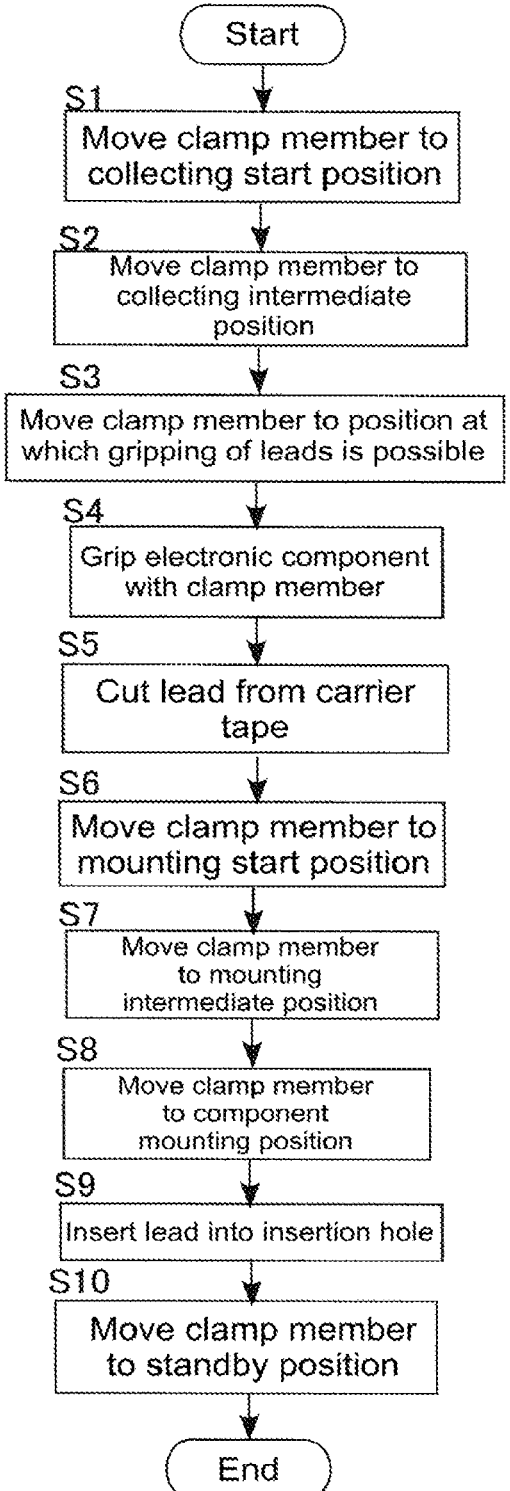
FIG. 2 is a flowchart for illustrating operation of the electronic component mounting machine.

Control device 14 then closes clamp member 19 to grip the leads El of the electronic component Ep (S4 of FIG. 2), and operates a cutter provided on component supply device 11 to cut the leads El of the electronic component Ep from carrier tape T (S5 of FIG. 2). Then, control device 14 moves the clamp member 19 gripping the leads El of the electronic component Ep to mounting start position Q3 above component mounting position Pp of board K (S6 of FIG. 2).

Control device 14 than lowers clamp member 19 gripping the leads El of the electronic component Ep to mounting intermediate position Q4 which is at a height at which the leads El do not interfere with board K (S7 of FIG. 2). Then, control device 14 moves the clamp member 19 gripping the leads El of the electronic component Ep towards component mounting position Pp of the board K to a position at which the leads El can be inserted into insertion holes H provided at component mounting position Pp of board K (S8 of FIG. 2).

Control device 14 then lowers shaft 20 to contact main body section Eb of the electronic component Ep, and opens clamp member 19 to release the leads El. Next, control device 14 lowers shaft 20 further to push the electronic component Ep and insert the leads El into insertion holes H (S9 of FIG. 2). Then, control device 14 bends leads El protruding downwards from insertion holes H using a bending device, which is not shown, provided on electronic component mounting machine 10. After clamp member 19 in an open state has been moved in the horizontal direction away from the electronic component Ep, clamp member 19 is moved to a standby position (S10 of FIG. 2). This completes one mounting cycle of an electronic component Ep.

Here, as described in the background art, if an operator makes an entry mistake when programming an operation program of electronic component mounting machine 10, clamp member 19 or a nozzle may interfere with a component supply device 11 adjacent to the component supply device 11 supplying the electronic component Ep to be collected or with an electronic component Ep being supplied by that component supply device 11. In the case of a nozzle, because the electronic component Ep is picked up by lowering the nozzle in a straight line from above the electronic component Ep, to a certain extent interference can be prevented by optimizer processing.

However, in the case of clamp member 19, because individual offset processing is required at collecting start position Q1, collecting intermediate position Q2, mounting start position Q3, and mounting intermediate position Q4, it is difficult to prevent the above interference with optimizer processing. Operation checking device 1 of electronic component mounting machine 10 of the present embodiment enables easy checking of operation of clamp member 19 as well as a nozzle to prevent the above interference.

Figure 3:
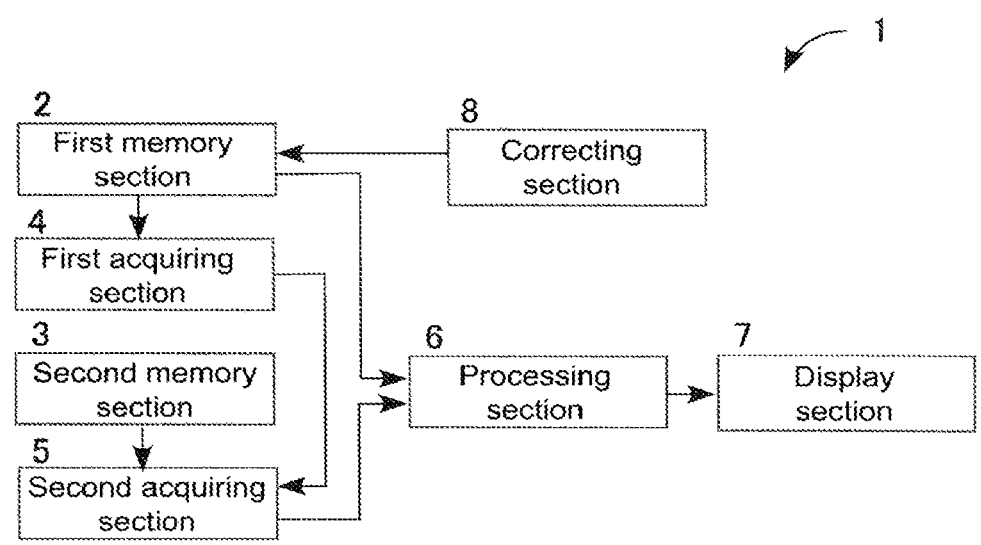
FIG. 3 shows the overall configuration of the operation checking device of the electronic component mounting machine.

3. Overall Configuration of Operation Checking Device of Electronic Component Mounting Machine The overall configuration of operation checking device 1 of electronic component mounting machine 10 is described below with reference to the figures. As shown in FIG. 3, operation checking device 1 is provided with first memory section 2, second memory section 3, first acquiring section 4, second acquiring section 5, processing section 6, display section 7, and correcting section 8.

Memorized in first memory section 2 are multiple types of operation programs for controlling operation from collecting to mounting of electronic components Ep by electronic component mounting machine 10, and multiple types of tables and the like referenced by each of the operation programs. Programmed in each operation program, for example, are items such as information of component supply devices 11 to be used, information of slots numbers in which the component supply devices 11 are loaded, information of the board K to be used, information of the mounting positions of electronic components Ep of the board K, information of the movement position of the clamp member 19 to be used, and offset values of collection start position Q1, collecting intermediate position Q2, mounting start position Q3, and mounting intermediate position Q4. Written to each table are, for example, correspondences between slot numbers and component names of electronic components Ep, types of clamp members 19 and component names of electronic components Ep and mounting positions of electronic components Ep and component names of electronic components Ep.

Memorized in second memory section 3 are items such as shape data of the multiple types of electronic components Ep, shape data of the multiple types of clamp members 19, shape data of the multiple types of component supply devices 11, and shape data of the multiple types of board K. The shape data of each electronic component Ep represents items such as the size of main body section Eb and length of leads El for each component name of electronic components Ep. The shape data of each clamp member 19 represents the size and the like of each clamp member 19 for each type of clamp member 19.

First acquiring section 4 acquires information of unmounted electronic components Ep that are targets for collection (also referred to as collection electronic components Ep), information of clamp members 19 to be used for collection electronic components Ep, information of component supply devices 11 to be used for collection electronic components Ep (also referred to as collection component supply devices 11), and information of boards K to be used for the collection electronic components Ep, based on the operation program required for the current operation memorized on first memory section 2. As information of collection electronic components Ep, there is information of the component name of the collection electronic component Ep that corresponds to the information of the slot number on which the collection component supply device 11 is loaded. As information of clamp member 19, there is information of the type of clamp member 19 corresponding to the component name of the collection electronic component Ep.

Further, first acquiring section 4 acquires information of the electronic component Ep (also referred to as adjacent electronic component Ep) supplied by component supply device 11 adjacent to the collection component supply device (also referred to as adjacent component supply device 11), information of adjacent component supply device 11, and information of electronic components Ep that have already been mounted on board K (also referred to as already mounted electronic components Ep), based on the operation program required for the current operation.

Second acquiring section 5 acquires from second memory section 3 shape data of collection electronic components Ep, shape data of clamp member 19, shape data of collection component supply device 11, and shape data of board K based on information of collection electronic component Ep to be acquired by first acquiring section 4, information of clamp member 19, information of collection component supply device 11 and information of board K. Further, second acquiring section 5 acquires shape data of adjacent electronic components Ep, shape data of adjacent component supply devices 11, and shape data of already mounted electronic components Ep based on information of adjacent electronic components Ep, information of adjacent component supply devices 11, and information of already mounted electronic components Ep.

Processing section 6 mainly performs processing of an operation simulation of clamp member 19 of electronic component mounting machine 10 based on the operation program required for the current operation memorized on first memory section 2. Display section 7 acquires, at the time of collection of the electronic component Ep by clamp member 19 or at a specified operation time before collection, component coordinates of the collection electronic component Ep, tool coordinates of clamp member 19, device coordinates of collection component supply device 11, component coordinates of adjacent electronic components Ep, and device coordinates of adjacent component supply devices 11, based on the operation simulation processed in processing section 6.

Further, display section 7 displays in three dimensions the shape data of the collection electronic component Ep, the shape data of clamp member 19, the shape data of collection component supply device 11, and the shape data of adjacent component supply device 11 acquired by second acquiring section 5 at the tool coordinates and each device coordinates.

Also, display section 7, acquires, at the time of mounting on board K of the electronic component Ep collected by clamp member 19 or at a specified operation time before mounting, component coordinates of the collection electronic component Ep, tool coordinates of clamp member 19, board coordinates of board K, and component coordinates of already mounted electronic components Ep, based on the operation simulation processed in processing section 6. Further, the shape data of the collection electronic components Ep, the shape data of already mounted electronic components Ep, the shape data of clamp member 19, and the shape data of board K acquired by the second acquiring section 5 are each displayed in three dimensions at the acquired component coordinates, tool coordinates, and board coordinates.

Correcting section 8, based on the three-dimensional display image of display section 7, in a case in which clamp member 19 interferes with any one of collection electronic component Ep, collection component supply device 11, adjacent electronic component Ep, adjacent component supply device 11, adjacent electronic component Ep, or board K, corrects the operation program so that interference does not occur. Also, when clamp member 19 mounts the collection electronic component Ep, in a case in which the collection electronic component Ep and an already mounted electronic component Ep will interfere and prevent mounting of the collection electronic component Ep, correction section 8 corrects the operation program by changing the movement path of clamp member 19 such that the collection electronic component Ep can be mounted. With this correction processing, an operator looks at the three-dimensional image and determines whether interference will occur with clamp member 19, and if determining that interference will occur, enters a command to prevent the interference.

4. Operation of Operation Checking Device of Electronic Component Mounting Machine Next, operation of operation checking device 1 of electronic component mounting machine 10 is described below with reference to the figures. Note that, operation is described for a case of displaying in three dimensions collection of electronic component Ep and mounting of electronic component Ep on board K. Also, it is assumed that items such as the operation program and tables are already memorized in first memory section 2, and that items such as various types of shape data are already memorized in second memory section 3.

Figure 4:
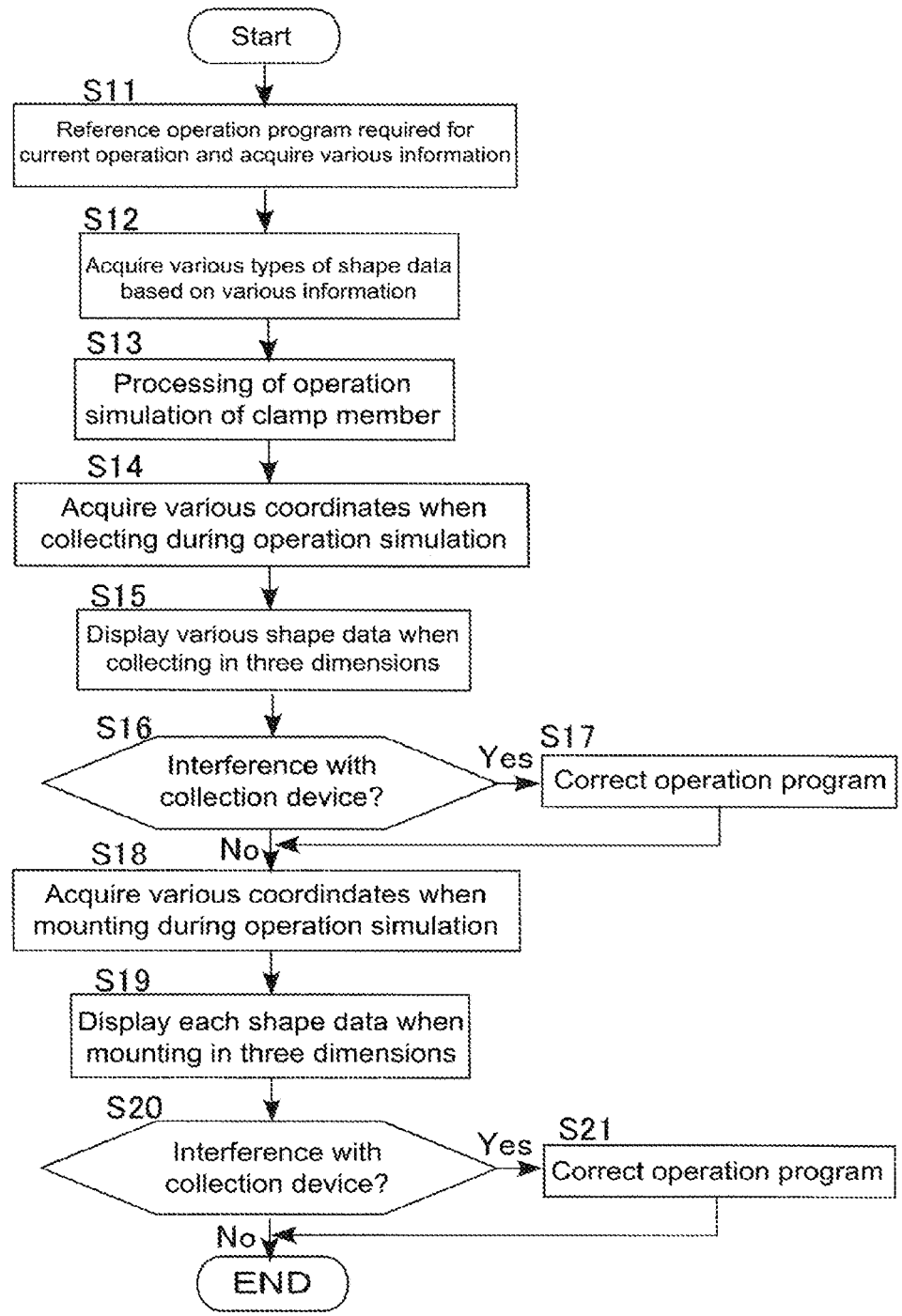
FIG. 4 is a flowchart for illustrating operation of the operation checking device of the electronic component mounting machine.

Operation checking device 1 references the operation program required for the current operation and acquires information of collection electronic components Ep, information of adjacent electronic components Ep, information of already mounted electronic components Ep, information of clamp member 19, information of collection component supply device 11, information of adjacent component supply device 11, and information of board K (S11 of FIG. 4).

Operation checking device 1, based on the acquired information, acquires shape data of the electronic components Ep to be collected, shape data of the adjacent electronic components Ep, shape data of the already mounted electronic components Ep, shape date of clamp member 19, shape data of collection component supply devices 19, shape data of adjacent component supply devices 11, and shape data of board K (S12 of FIG. 4). Then, based on the operation program required for the current operation, operation checking device 1 performs processing of operation simulation of clamp member 19 (S13 of FIG. 4).

Operation checking device 1, in the operation simulation, acquires the component coordinates of the collection electronic component Ep during collection of the collection electronic component Ep by clamp member 19, as well as the component coordinates of the adjacent electronic components Ep, the device coordinates of the collection component supply device 11, the device coordinates of the adjacent component supply devices 11, and the tool coordinates of clamp member 19 (S14 of FIG. 4).

Figure 5:
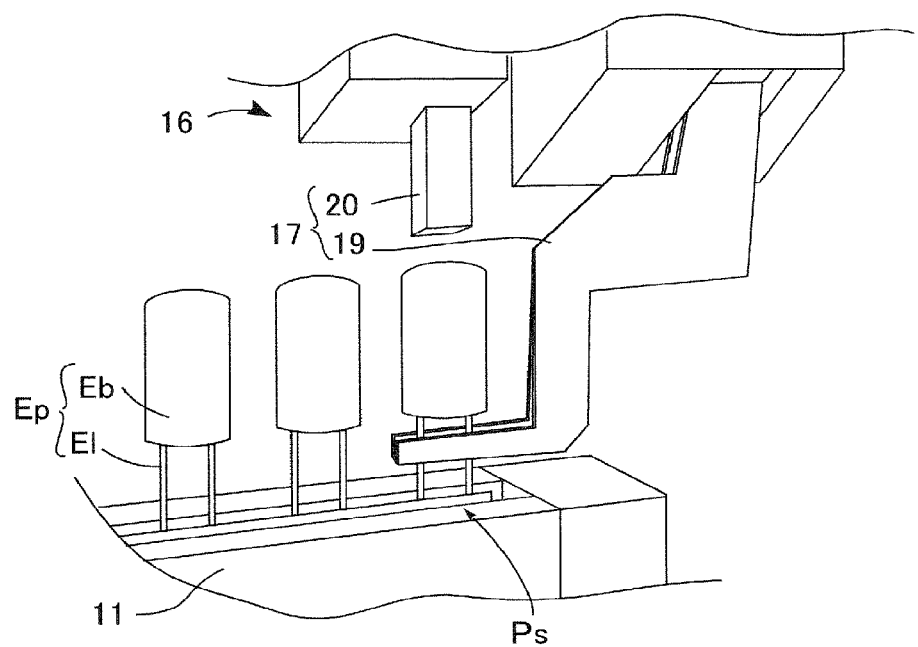
FIG. 5 shows a three-dimensional display image of a clamp member, electronic components, and other items during component collection.

Operation checking device 1 displays in three dimensions each of the shape data of collection electronic component Ep, the shape data of adjacent electronic components Ep, the shape data of collection component supply device 11, the shape data of adjacent component supply devices 11, and the shape data of clamp member 19 at the respective component coordinates, device coordinates, and tool coordinates. This three-dimensional image is displayed as shown in FIG. 5. Note that, the shapes of adjacent electronic components Ep and the shapes of adjacent component supply devices 11 are omitted from FIG. 5, but are displayed in a similar way to the shape of collection electronic component Ep and the shape of collection component supply device 11.

Here, an operator looks at the three-dimensional image to check whether interference will occur between the clamp member 19 and any one of the collection electronic component Ep, the adjacent electronic components Ep, collection component supply device 11, or adjacent component supply devices 11. Then, if it is determined that the above interference will occur, the operator enters a command to prevent the interference to operation checking device 1. Operation checking device 1, when the above interference prevention commanded has been entered, determines that interference will occur (yes in S16 of FIG. 4) and corrects the operation program based on the interference prevention command (S17 of FIG. 4).

On the other hand, if the operator determines that the above interference will not occur, they enter a command to operation checking device 1 to continue processing. Operation checking device 1, when the command to continue processing is entered, determines that the above interference will not occur (no in S16 of FIG. 4), and in the operation simulation, acquires the component coordinates of the collection electronic component Ep during mounting of the collection electronic component Ep on board K by clamp member 19, as well as the component coordinates of the already mounted electronic components Ep, the board coordinates of the board K, and the tool coordinates of clamp member 19 (S18 of FIG. 4).

Figure 6:
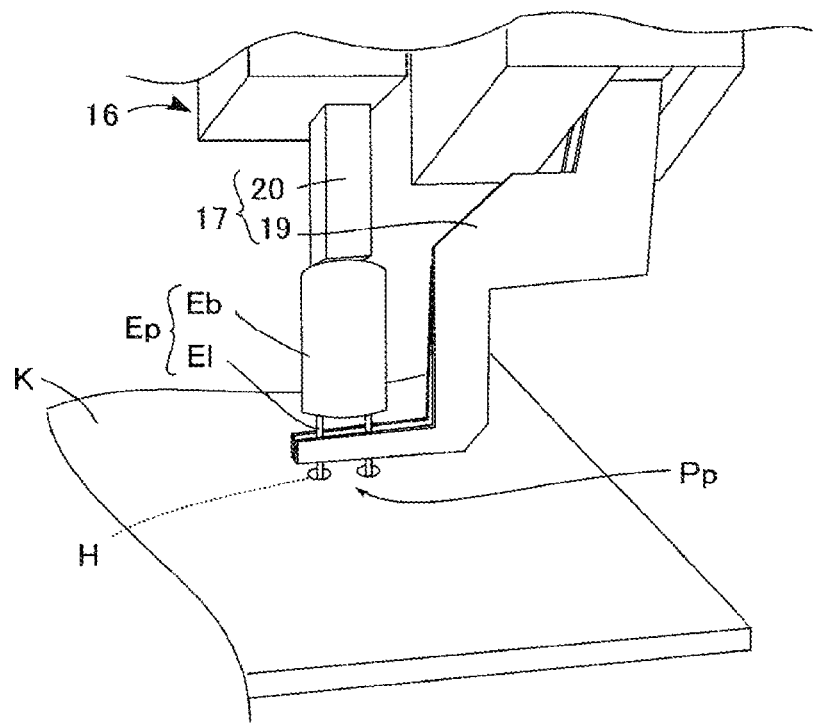
FIG. 6 shows a three-dimensional display image of a clamp member, electronic component, and other items during component mounting.

Operation checking device 1 displays in three dimensions each of the shape data of collection electronic component Ep, the shape data of adjacent electronic components Ep, the shape data of already mounted electronic components Ep, the shape data of board K, and the shape data of clamp member 19 at the respective component coordinates, board coordinates, and tool coordinates. This three-dimensional image is displayed as shown in FIG. 6. Note that, the shapes of already mounted electronic components Ep are omitted in FIG. 6, but are displayed in a similar way to the shape of collection electronic component Ep.

Here, an operator looks at the three-dimensional image to check whether interference will occur between the clamp member 19 and any one of the already mounted electronic components 19 or board K. Then, if it is determined that the above interference will occur, the operator enters a command to prevent the interference to operation checking device 1. Operation checking device 1, when the above interference prevention command has been entered, determines that interference will occur (yes in S20 of FIG. 4) and corrects the operation program based on the interference prevention command (S21 of FIG. 4). On the other hand, if the operator determines that the above interference will not occur, they enter a command to operation checking device 1 to end processing. Operation checking device 1, when the above end processing command has been entered, determines that the above interference will not occur (no in S20 of FIG. 4) and ends processing.

5. Correction Processing of Operation Program 5-1. First Example

Figure 7:
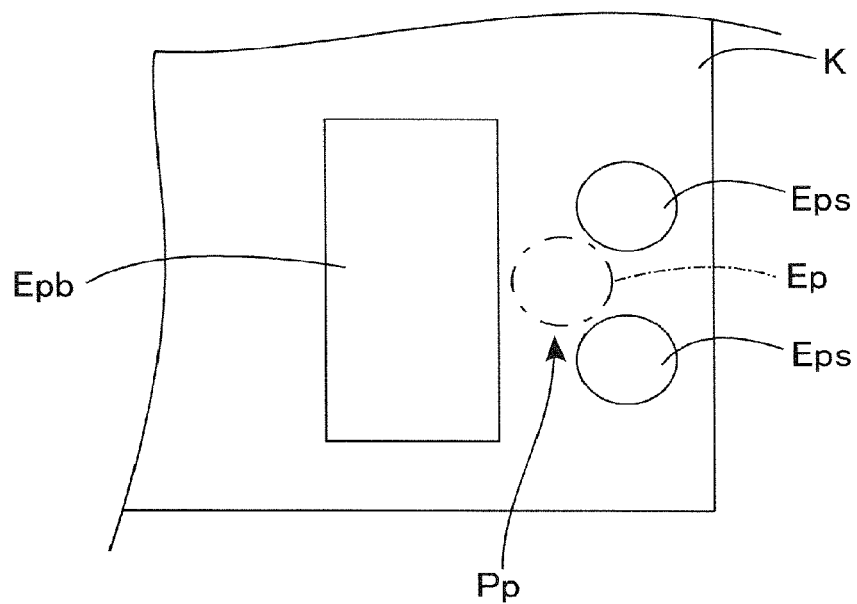
FIG. 7 shows a first example of the relationship between electronic components already mounted on a board and the component mounting position of a collected electronic component in order to illustrate correction processing of an operation program.

Next, correction processing of the operation program for preventing interference when mounting collection electronic component Ep on board K using clamp member 19 is described with reference to the figures. As an example, as shown in FIG. 7, two small already mounted electronic components Eps are arranged on board K separated by a specified gap in the top-bottom direction in the figure, and one large already mounted electronic component Epb is arranged on board K separated from the two small already mounted electronic components Eps by a specified gap in the left-right direction of the figure.

The arrangement gap of the two small already mounted electronic components Eps is narrower than the diameter of main body section Eb of collection electronic component Ep. Further, collection electronic component Ep is to be mounted at component mounting position Pp shown enclosed by the broken line in the figure, between the two small already mounted electronic components Eps and the large already mounted electronic component Epb.

Also, it is assumed that clamp member 19 is unable to reach component mounting position Pp between the large already mounted electronic component Epb and one of the small already mounted electronic components Eps due to interference with the large already mounted electronic component Epb, and that clamp member 19 is unable to reach component mounting position Pp from above due to interference with the small already mounted electronic components Eps. Further, it is assumed that clamp member 19 is able to pass between the two small already mounted electronic components Eps without interfering with the two small already mounted electronic components Eps.

In such a case, because the arrangement gap between the two small already mounted electronic components Eps is narrower than the diameter of main body section Eb of collection electronic component Ep, if clamp member 19 passes between the two small already mounted electronic components Eps, the collection electronic component Ep will contact the two small already mounted electronic components Eps.

However, as the small already mounted electronic components Eps are radial components, when collection electronic component Ep enters between the two small already mounted electronic components Eps, leads El of the two small already mounted electronic components Eps elastically deform, and the two small already mounted electronic components Eps are pushed out at both sides of collection electronic component Ep. Accordingly, clamp member 19 can mount collection electronic component Ep at component mounting position Pp without interfering with the small already mounted electronic components Eps.

Described next is correction processing of the operation program in a case in which an operator mistakenly performs the following: "Mounting collection electronic component Ep at component mounting position Pp by making clamp member 19 reach component mounting position Pp passing between the large already mounted electronic component Epb and one of the small already mounted electronic components Eps", when programming an operation program that performs component mounting as described above.

Figure 8:
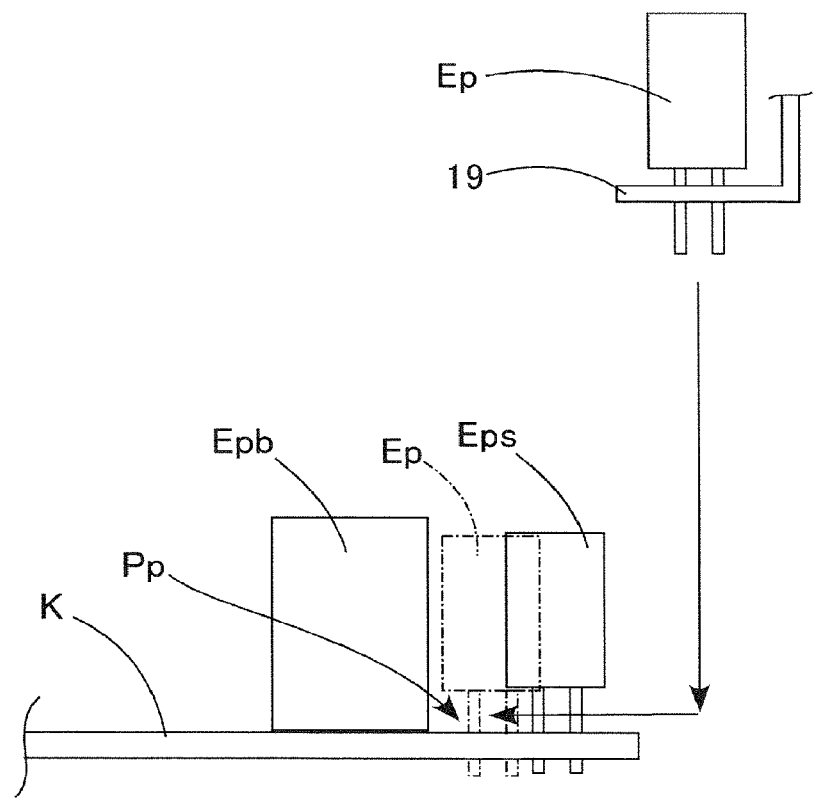
FIG. 8 shows an operation path of the clamp member for mounting the collected electronic component of FIG. 7 at the component mounting position.

In such a case, the operator checks whether clamp member 19 will interfere with the large already mounted electronic component Epb at operation checking device 1, and enters an interference prevention command at operation checking device 1. Then, operation checking device 1, as shown in the steps below, that is, FIG. 8, corrects the operation program such that the following operation can be performed: "Collection electronic component Ep is mounted at component mounting position Pp by clamp member 19 being made to reach component mounting position Pp between the two small already mounted electronic components Eps".

Figure 9A:
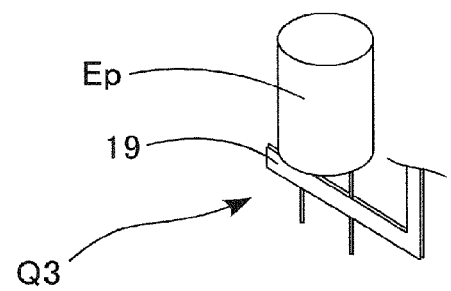
FIG. 9A shows a state along the operation path of the clamp member of FIG. 8 with the clamp member positioned at a mounting start position.
Figure 9A:
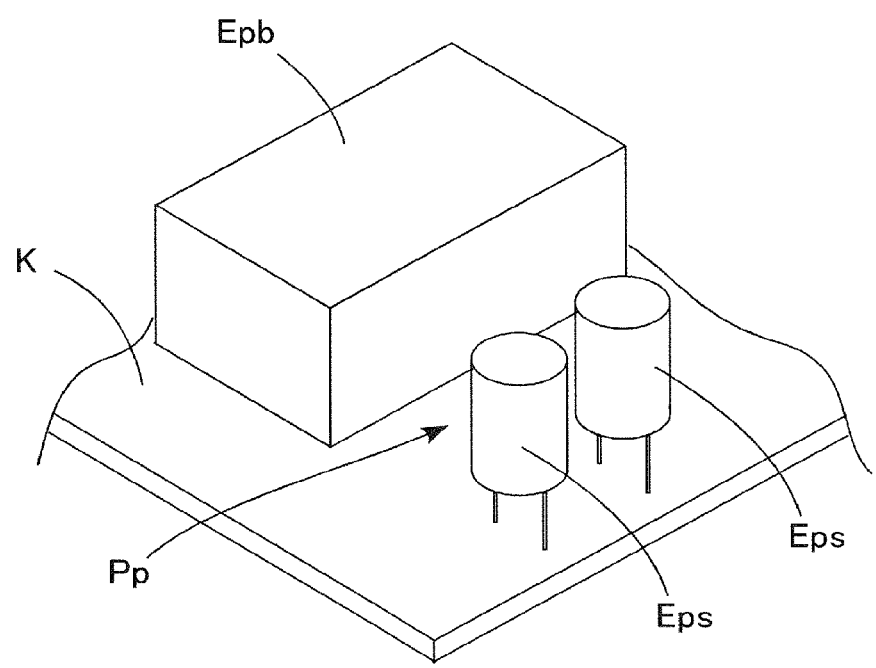
Figure 9B:
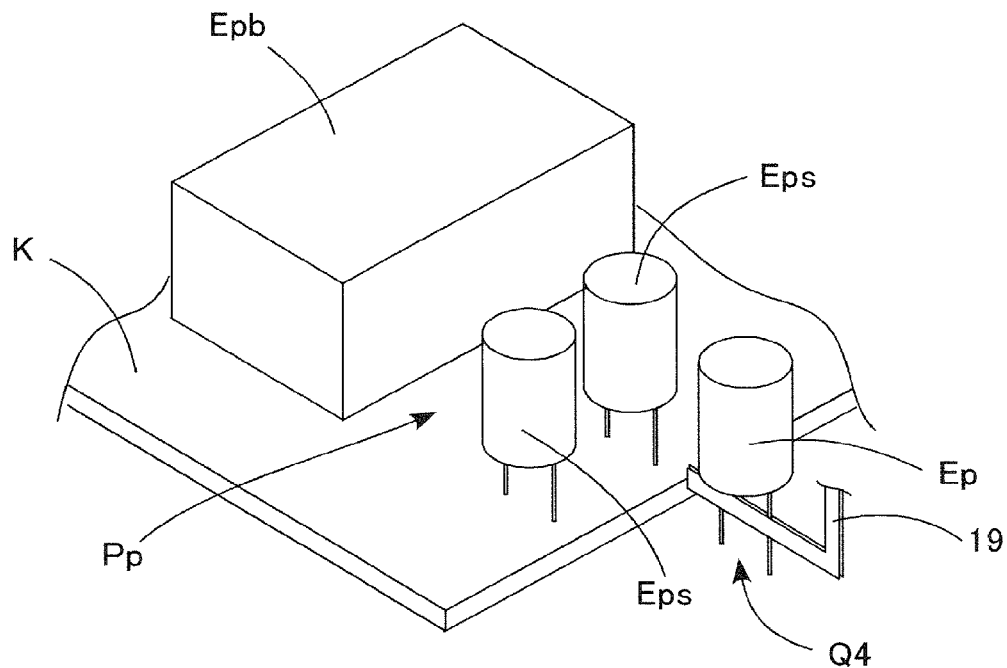
FIG. 9B shows a state along the operation path of the clamp member of FIG. 8 with the clamp member moved to a mounting intermediate position.
Figure 10:
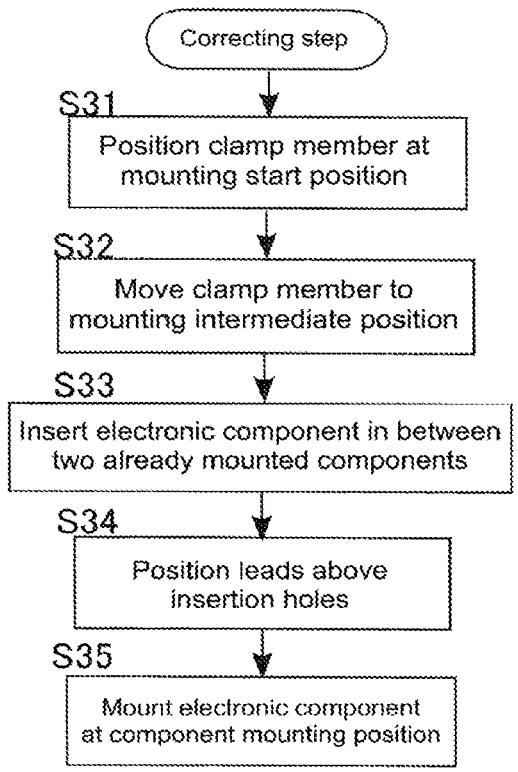
FIG. 10 is a flowchart for illustrating the correcting step of the operation checking device of the electronic component mounting machine.

As shown in FIG. 9A, operation checking device 1 positions clamp member 19 at mounting start position S3 above, in front of in a horizontal direction, and between the two small already mounted electronic components Ep, with collection electronic component Ep facing the two small already mounted electronic components Eps (S31 of FIG. 10). Further, as shown in FIG. 9B, clamp member 19 is lowered from mounting start position Q3 to mounting intermediate position Q4 in front of in the horizontal direction and between the two small already mounted electronic components Eps (S32 in FIG. 10).

Figure 9C:
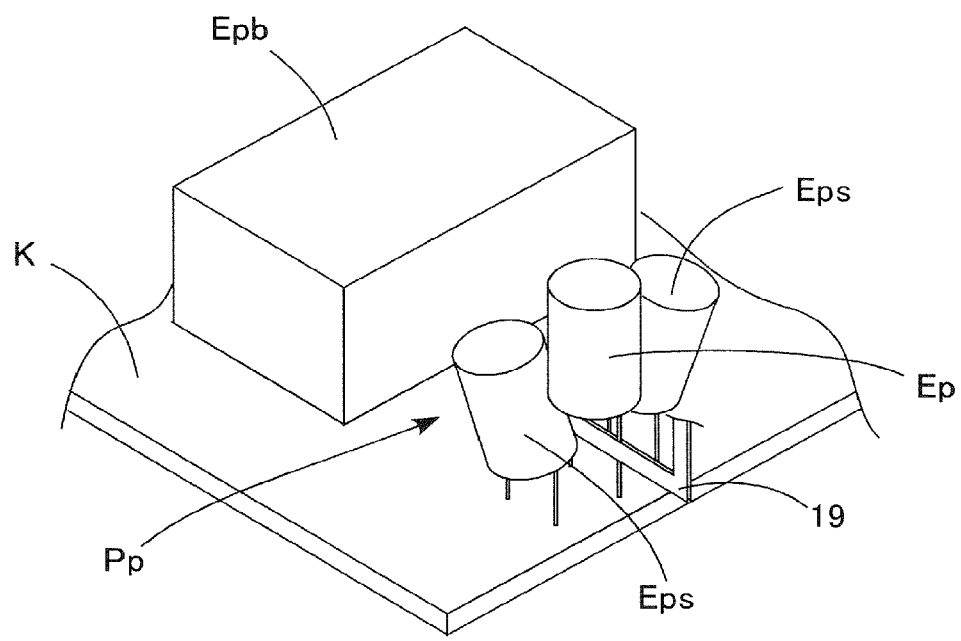
FIG. 9C shows a state along the operation path of the clamp member of FIG. 8 with the collected electronic component pushed between already mounted electronic components.

As shown in FIG. 9C, operation checking device 1 moves clamp member 19 horizontally in between the two small already mounted electronic components Eps to insert collection electronic component Ep in between the two small already mounted electronic components Eps (S33 in FIG. 10). By this, collection electronic component Ep contacts the two small already mounted electronic components Eps such that leads El are elastically deformed, the two small already mounted electronic components Eps are pushed out by both sides of collection electronic component Ep, and collection electronic component Ep is inserted to the component mounting position Pp side.

Figure 9D:
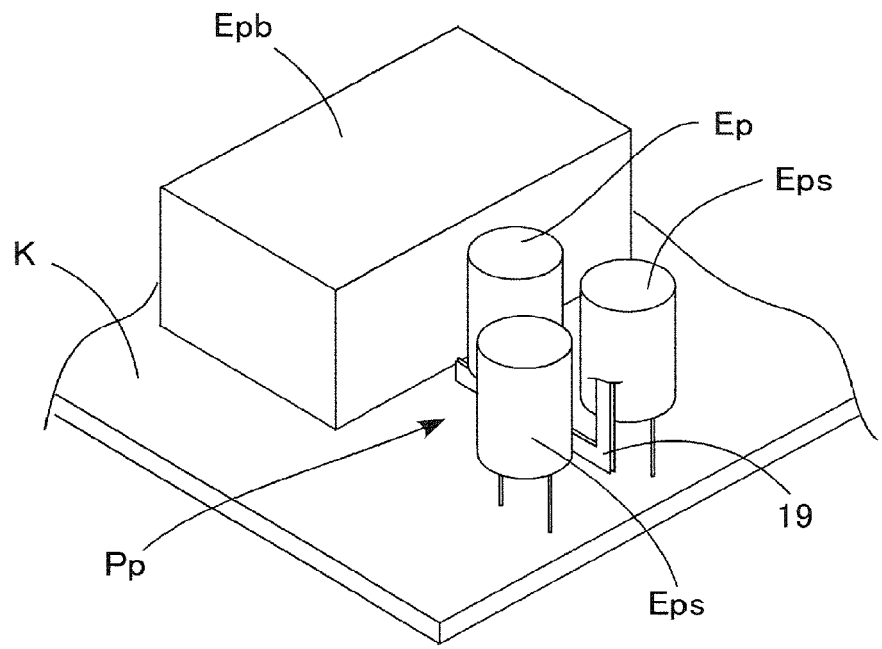
FIG. 9D shows a state along the operation path of the clamp member of FIG. 8 with the leads of the electronic component positioned above the insertion holes.
Figure 9E:
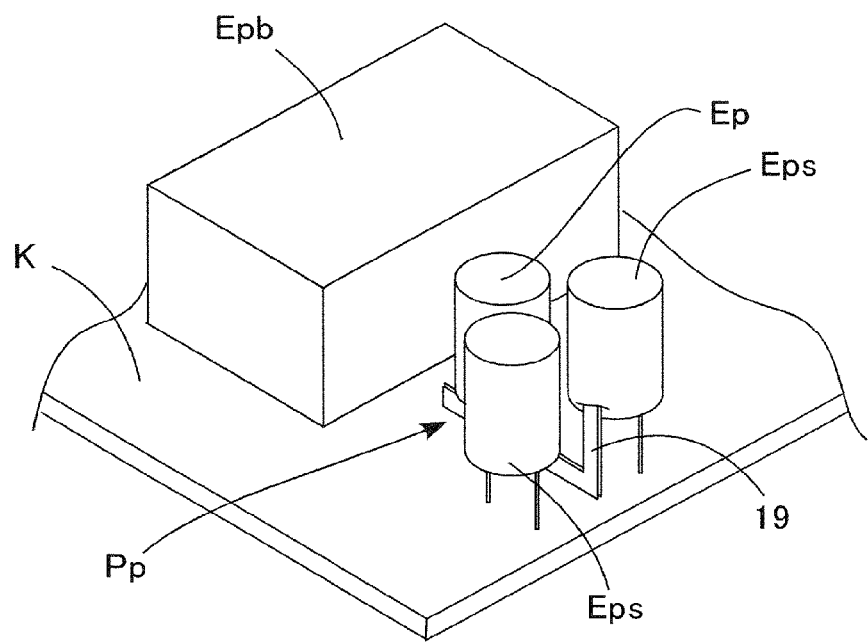
FIG. 9E shows a state along the operation path of the clamp member of FIG. 8 with the collected electronic component mounted at the component mounting position.

As shown in FIG. 9D, operation checking device 1 further moves clamp member 19 horizontally such that leads El of collection electronic component Ep are positioned above insertion holes H provided at component mounting position Pp (S34 of FIG. 10). Accordingly, because collection electronic component Ep is separated from the two small already mounted electronic components Eps, the elastic deformation of leads El of the two small already mounted electronic components Eps no longer occurs and the two small already mounted electronic components Eps return to their original mounting state. Then, as shown in FIG. 9E, shaft 20 is lowered to push collection electronic component Ep such that leads El of collection electronic component Ep are inserted into insertion holes H, thereby mounting collection electronic component Ep at component mounting position Ps (S35 of FIG. 10).

5-2. Second Example

Figure 11:
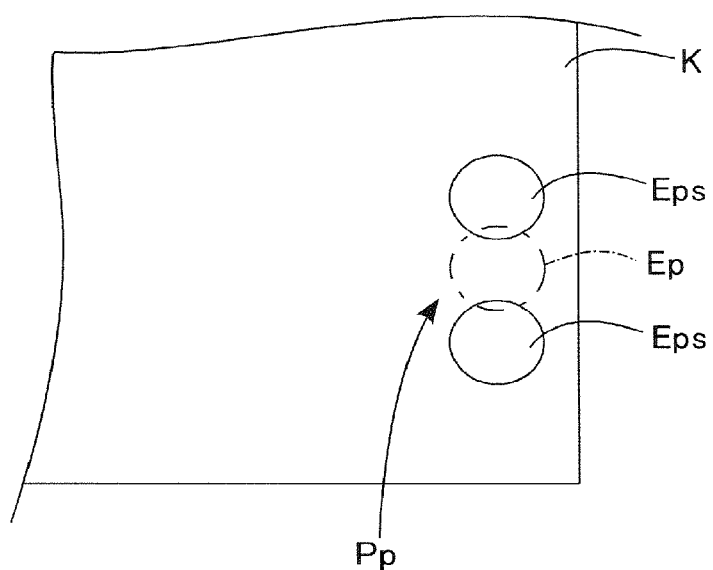
FIG. 11 shows a second example of the relationship between electronic components already mounted on a board and the component mounting position of a collected electronic component in order to illustrate correction processing of an operation program.

Next, correction processing of the operation program for preventing a situation where mounting is impossible when mounting collection electronic component Ep on board K using clamp member 19 is described with reference to the figures. As an example, as shown in FIG. 11, two already mounted electronic components Eps, which are radial components, are arranged on board K separated by a specified gap in the top-bottom direction in the figure. The arrangement gap of the two already mounted electronic components Eps is narrower than the diameter of main body section Eb of collection electronic component Ep, which is a radial component. Further, collection electronic component Ep is to be mounted at component mounting position Pp shown enclosed by the broken line in the figure, between the two already mounted electronic components Eps.

In such a case, if clamp member 19 is inserted from above component mounting position Pp, the lower surface of main body section Eb of collection electronic component Ep and the upper surfaces of main body section Eb of the already mounted electronic components Eps interfere, and insertion to component mounting position Pp is not possible. On the other hand, if clamp member 19 is inserted horizontally between the two already mounted electronic components Eps, because the arrangement gap of the two already mounted electronic components Eps is narrower than the diameter of main body section Eb of collection electronic component Ep, collection electronic component Ep contacts the two already mounted electronic components Eps.

Figure 12:
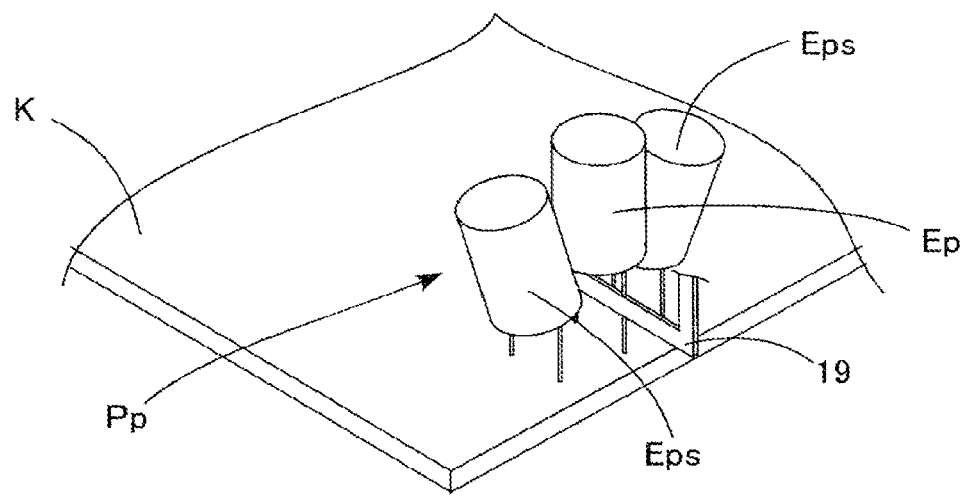
FIG. 12 shows a state with respect to the second example of FIG. 11 with the collected electronic component mounted at the component mounting position.

However, as the already mounted electronic components Eps are radial components, when collection electronic component Ep enters between the two already mounted electronic components Eps, leads El of the two already mounted electronic components Eps elastically deform, and the two already mounted electronic components Eps are pushed out at both sides of collection electronic component Ep. Accordingly, as shown in FIG. 12, clamp member 19 can mount collection electronic component Ep at component mounting position Pp with the two already mounted electronic components Eps in a slanted state.

Described next is correction processing of the operation program in a case in which the operator mistakenly performs the following: "Mounting collection electronic component Ep at component mounting position Pp by making clamp member 19 reach component mounting position Pp from above component mounting position Pp", when programming an operation program that performs component mounting as described above. That is, operation checking device 1 performs operation similar to operation described for FIGS. 9A and 9B of the first example, and subsequently, as shown in FIG. 12, corrects the operation program such that operation of mounting collection electronic component Ep at component mounting position Pp in a state with the two already mounted electronic components Eps in a leaning state can be performed.

6. Other

Note that, with the above embodiments, an example is described applied to electronic component mounting machine 10 that mounts radial components as electronic components Ep, but an electronic component mounting machine that mounts axial components may be similarly applied. Further, an example is described above applied to electronic component mounting machine 10 that grips leads El of electronic components Ep using clamp member 19, but an electronic component mounting machine that picks up an electronic component EP with a nozzle using suction may be similarly applied.

7. Effects of Embodiments

Operation checking device 1 of electronic component mounting machine 10 of the present embodiment is operation checking device 1 of electronic component mounting machine 10 that collects electronic component Ep supplied by component supply position Ps of supply device 11 using collecting device 17, moves the collection electronic component Ep to board K conveyed to board conveyance position Pk, and mounts the moved electronic component Ep at component mounting position Pp of board K. Operation checking device 1 is provided with first memory section 2 configured to memorize an operation program of electronic component mounting machine 10 including at least a collection operation of the electronic component Ep by collecting device 17; second memory section 3 configured to memorize shape data of the electronic component Ep and shape data of collecting device 17; first acquiring section 4 configured to acquire information of the electronic components Ep and information of collecting device 17 based on the operation program required for a current operation memorized on first memory section 2; and second acquiring section 5 configured to acquire corresponding shape data of the electronic component Ep and shape data of collecting device 17 from second memory section 3 based on the information of the electronic component Ep and the information of collecting device 17 acquired by first acquiring section 4.

Operation checking device 1 is further provided with processing section 6 configured to perform processing of operation simulation of electronic component mounting machine 10 based on the operation program required for the current operation memorized on first memory section 2, and display section 7 configured to acquire component coordinates of the electronic component Ep during collection of the electronic component Ep by collecting device 17 and tool coordinates of collecting device 17 based on the operation simulation processed by processing section 6, and display in three dimensions the shape data of the electronic component Ep and the shape data of collecting device 17 acquired by second acquiring section 5 at the acquired component coordinates and tool coordinates. Accordingly, it is possible to check operation from collecting to mounting of electronic component Ep, in particular during collecting, enabling the electronic component Ep to be collected reliably and improving component mounting efficiency.

Further, display section 7, based on the operation simulation, acquires the component coordinates and the tool coordinates at a specified time up until collection of the electronic component Ep by collecting device 17, and displays in three dimensions the shape data of the electronic component and the shape data of collecting device 17 at the acquired component coordinates and the tool coordinates. Accordingly, because the operating state of collecting device 17 until collection of electronic component Ep is understood, it is possible to optimize operation of collection device 17.

Further, electronic component mounting machine 10 is provided with multiple supply devices 11 arranged such that multiple of the component supply positions PS are lined up, first acquiring section 4 is configured to acquire the information of an adjacent electronic component Ep supplied to component supply position Ps adjacent to component supply position Ps of the electronic component Ep being supplied that is a target for collection, based on the operation program required for the current operation, second acquiring section 5 is configured to acquire the shape data of the adjacent electronic component based on the information of the adjacent electronic component, and display section 7 is configured to, based on the operation simulation, acquire adjacent component coordinates of the adjacent electronic component Ep and display in three dimensions the shape data of the adjacent electronic component Ep at the acquired adjacent component coordinates. Accordingly, the arrangement of supply devices 11 of adjacent electronic components Ep can be optimized such that collecting device 17 does not interfere with adjacent electronic components during collection of electronic components Ep.

Further, display section 7, based on the operation simulation, acquires the component coordinates of collected electronic component Ep and the tool coordinates of collecting device 17 at a specified time up until collection of the electronic component Ep by collecting device 17, and displays in three dimensions the shape data of the collected electronic component Ep and the shape data of collecting device 17 at the acquired component coordinates and tool coordinates. Accordingly, it is possible to reliably mount electronic component Ep on board K, and to improve production efficiency of board K.

Further, display section 7, based on the operation simulation, acquires the component coordinates of collected electronic component Ep and the tool coordinates of collecting device 17 at a specified time up until mounting of the electronic component Ep on board K by collecting device 17, and displays in three dimensions the shape data of the collected electronic component Ep and the shape data of collecting device 17 at the acquired component coordinates and tool coordinates. Accordingly, because the operating state of collecting device 17 until mounting of electronic component Ep is understood, it is possible to optimize operation of collection device 17.

Also, first acquiring section 4, based on the operation program required for the current operation, acquires information of electronic components Ep already mounted on board K, and second acquiring section 5, based on information of already mounted electronic components Ep, acquires shape data of the already mounted electronic components Ep, and display section 7, based on the operation simulation, acquires the component coordinates of the already mounted electronic components Ep and displays in three dimensions the shape data of the already mounted electronic components Ep at the acquired component coordinates of the already mounted electronic components Ep. By this, it is possible to prevent interference between already mounted electronic components Ep and collecting device 17 during mounting of electronic components Ep, thus curtailing the occurrence of defective boards.

Also, electronic components Ep have leads El, and collecting device 17 has gripping claws 19 capable of gripping leads El. Accordingly, it is possible to prevent interference between electronic components Ep that have leads El and collecting device 17 for which it is difficult to prevent interference with collecting device 17 using optimizer processing.

Further, because operation checking device 1 of electronic component mounting machine 10 is provided with correcting section 8 that, in a case in which collecting device 17 will interfere with another member, or a case in which other members will interfere with each other, corrects the operation program based on the three-dimensional display image of display section 7 such that the interference does not occur, the workload on the operator is reduced.

Also, electronic component Ep has leads El, collecting device 17 has gripping claw 19 configured to grip leads El, and correcting section 8 is configured to, when mounting the electronic component Ep collected by collecting device 17 (an unmounted component) at component mounting position Pp between two electronic components Ep already mounted on the board K adjacently (already mounted components), in a case in which collecting device 17 or the unmounted component Ep will interfere with the already mounted component Ep, correct the operation program that is configured to execute a step of positioning collecting device 17 at mounting start position Q3 above and in front of in a horizontal direction a position between the already mounted components Ep such that the unmounted component Ep faces a side between the two already mounted components Ep, a step of lowering collecting device 17 from the mounting start position Q3 to a front side in the horizontal direction between the two already mounted components Ep, a step of orienting collecting device 17 between the two already mounted components Ep, and moving collecting device 17 horizontally, so as to push the unmounted component Ep between the two mounted components Ep, a step of positioning the unmounted component Ep above component mounting position Pp, and a step of lowering collecting device 17 to mount the unmounted component Ep component mounting position Pp. This greatly reduces the workload on the operator.

REFERENCE SIGNS LIST

1: operation checking device of electronic component mounting machine; 2: first memory section; 3: second memory section; 4: first acquiring section; 5: second acquiring section; 6: processing section; 7: display section; 8: correcting section; 10: electronic component mounting machine; 11: component supply device; 12: board conveyance device; 13: component transfer device; 14: control device; 17: component collecting device; 19: clamp member; Ep: electronic component

The invention claimed is:
1. An operation checking device of an electronic component mounting machine that uses a collecting device to collect an electronic component supplied at a component supply position of a supply device, move the collected electronic component to a board conveyed to a board conveyance position, and mount the collected electronic component at a component mounting position of the board, the operation checking device comprising:
  a first memory configured to memorize an operation program of the electronic component mounting machine including at least a collection operation of the electronic component by the collecting device;
  a second memory configured to memorize shape data of the electronic component and shape data of the collecting device;
  a first acquiring section configured to acquire information of the electronic component and information of the collecting device based on the operation program required for a current operation memorized on the first memory;
  a second acquiring section configured to acquire corresponding shape data of the electronic component and shape data of the collecting device from the second memory based on the information of the electronic component and the information of the collecting device;
  a processor configured to perform processing of operation simulation of the electronic component mounting machine based on the operation program required for the current operation memorized on the first memory; and a display section configured to acquire component coordinates of the electronic component during collection of the electronic component by the collecting device and tool coordinates of the collecting device based on the operation simulation, and display the shape data of the electronic component and the shape data of the collecting device at the acquired component coordinates and the tool coordinates.

2. The operation checking device of the electronic component mounting machine of claim 1, wherein the display section is configured to, based on the operation simulation, acquire the component coordinates and the tool coordinates at a specified operating time up until collection of the electronic component by the collecting device, and display the shape data of the electronic component and the shape data of the collecting device at the acquired component coordinates and the tool coordinates.

3. The operation checking device of the electronic component mounting machine of claim 1, wherein the electronic component mounting machine is provided with multiple of the supply devices arranged such that multiple of the component supply positions are lined up, the first acquiring section is configured to acquire the information of an adjacent electronic component supplied to the component supply position adjacent to the component supply position of the electronic component being supplied that is a target for collection, based on the operation program required for the current operation, the second acquiring section is configured to acquire the shape data of the adjacent electronic component based on the information of the adjacent electronic component, and the display section is configured to, based on the operation simulation, acquire adjacent component coordinates of the adjacent electronic component, and display the shape data of the adjacent electronic component at the acquired adjacent component coordinates.

4. The operation checking device of the electronic component mounting machine of claim 1, wherein the display section is configured to, based on the operation simulation, acquire the component coordinates of the collected electronic component and the tool coordinates of the collecting device when the electronic component collected by the collecting device is mounted on the board, and display the shape data of the collected electronic component and the shape data of the collecting device at the acquired component coordinates and the tool coordinates.

5. The operation checking device of the electronic component mounting machine of claim 1, wherein the display section is configured to, based on the operation simulation, acquire the component coordinates of the collected electronic component and the tool coordinates of the collecting device at a specified operating time up until the electronic component collected by the collecting device is mounted on the board, and display the shape data of the collected electronic component and the shape data of the collecting device at the acquired component coordinates and the tool coordinates.

6. The operation checking device of the electronic component mounting machine of claim 4, wherein the first acquiring section is configured to acquire the information of the electronic component that has been mounted on the board based on the operation program required for the current operation, the second acquiring section is configured to acquire the shape data of the electronic component that has been mounted based on the information of the electronic component that has been mounted, and the display section is configured to, based on the operation simulation, acquire the component coordinates of the electronic component that has been mounted, and display the shape data of the electronic component that has been mounted at the acquired component coordinates of the electronic component that has been mounted.

7. The operation checking device of the electronic component mounting machine of claim 1, wherein the information of the electronic component includes that the electronic component has a lead, and the information of the collecting device includes that the collecting device has a gripping claw configured to grip the lead.

8. The operation checking device of the electronic component mounting machine of claim 1, further comprising:

a correcting section configured to correct the operation program such that interference does not occur in a case in which the collecting device interferes with another member, or a case in which other members interfere with each other, based on a display image of the display section.

9. The operation checking device of the electronic component mounting machine of claim 8, wherein the correcting section is configured to, when mounting an unmounted component collected by the collecting device at the component mounting position between two electronic components already mounted on the board adjacently, in a case in which the collecting device or the unmounted component will interfere with an already mounted component, correct the operation program that is configured to execute:

a step of positioning the collecting device at a mounting start position above and in front of in a horizontal direction a position between the already mounted components such that the unmounted component faces a side between the two already mounted components, a step of lowering the collecting device from the mounting start position to a front side in the horizontal direction between the two already mounted components, a step of orienting the collecting device between the two already mounted components, and moving the collecting device horizontally, so as to push the unmounted component between the two already mounted components, a step of positioning the unmounted component above the component mounting position, and a step of lowering the collecting device to mount the unmounted component at the component mounting position.

* * * * *